United States Patent [19]
Ohgami et al.

[11] 4,451,793
[45] May 29, 1984

[54] CONTROL SYSTEM

[75] Inventors: Masaaki Ohgami, Musashino; Fujio Matsui, Mitaka, both of Japan

[73] Assignee: Fuji Jukogyo Kabushiki Kaisha, Tokyo, Japan

[21] Appl. No.: 174,374

[22] Filed: Aug. 1, 1980

[30] Foreign Application Priority Data

Aug. 2, 1979 [JP] Japan ................................ 54-98855

[51] Int. Cl.³ ........................ H03K 3/023; H03K 5/08

[52] U.S. Cl. ...................................... 328/69; 307/264; 328/172

[58] Field of Search ...................... 123/440; 328/69, 1, 328/71, 175, 172; 307/229, 490, 491, 494, 498, 511, 529, 234, 264, 262

[56] References Cited

U.S. PATENT DOCUMENTS 3,676,782 7/1972 Lane ........................................ 328/1
3,900,012 8/1975 Wahl .................................. 123/440

OTHER PUBLICATIONS

"Signal Stabilization of a Control System", *Rufus Oldenberger, ASME Transactions,* 11/75, pp. 1869–1872.

*Primary Examiner*—John Zazworsky
*Attorney, Agent, or Firm*—Martin A. Farber

[57] ABSTRACT

A feedback control system in which the error signal is oscillated by a dither signal having a periodical pattern for oscillating the controlled output. The dither signal comprises a plurality of positive excursions and negative excursions, and at least one of the positive excursions is lower than the others and at least one of the negative excursions is shallower than the others. The dither signal is applied to an actuator to produce a controlled output. A detector senses the value of the controlled output caused by the operation of the actuator. The detector is adapted to produce an output signal in which portions corresponding to at least the low positive excursion or negative excursion of the dither signal are removed when the controlled output deviates from a desired value in different directions.

A comparing circuit compares the output signal of the detector with a standard signal value. The output signal of the comparing circuit is signal for detecting the removed portions. The output signal therefrom is fed to a shift signal generating circuit for shifting the dither signal for correcting the deviation of the controlled output. An amplitude control circuit is provided for reducing the amplitude of the dither signal when the comparing circuit produces a signal representing a condition of the controlled output in a central range with respect to the desired value so that the amplitude of the controlled output can be reduced.

20 Claims, 14 Drawing Figures

FIG. 6A
FIG. 6B
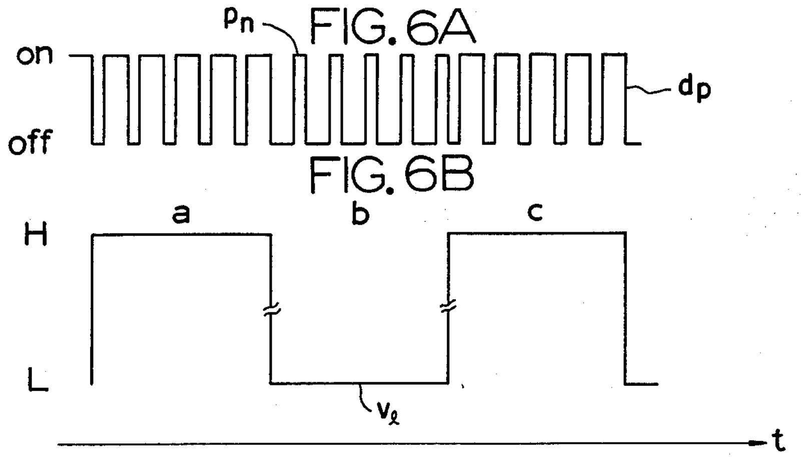
FIG. 7
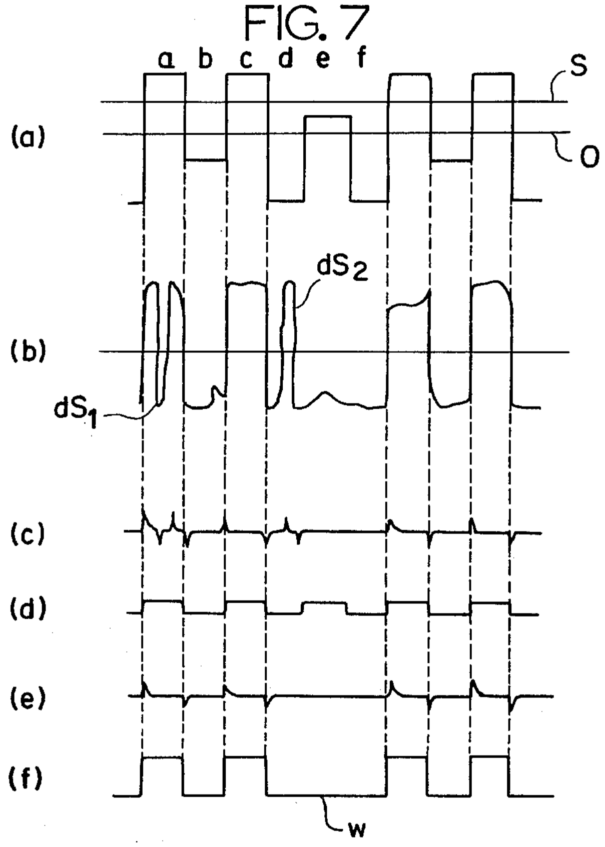

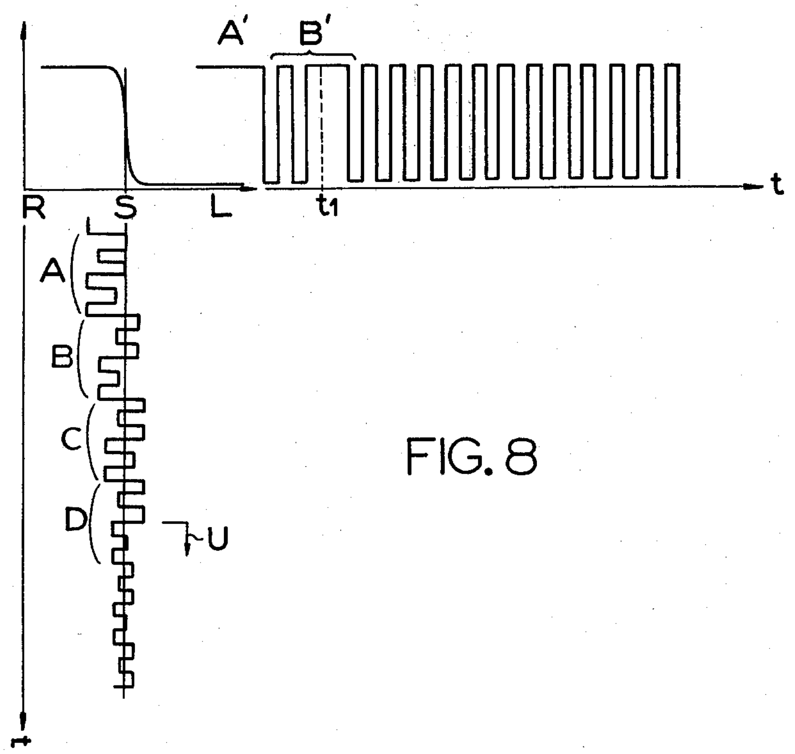
FIG. 8
FIG. 11
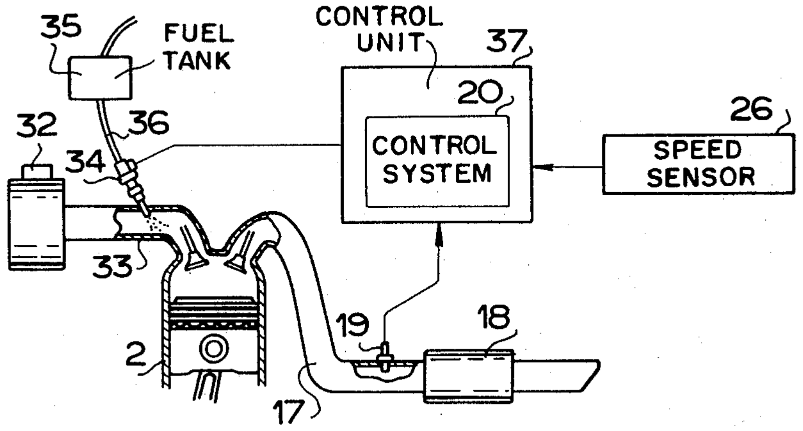

CONTROL SYSTEM

BACKGROUND OF THE INVENTION

The present invention relates to a control system, such as a system for controlling the air-fuel ratio for an internal combustion engine emission control system having a three-way catalyst, and more particularly to a system for controlling the air-fuel ratio to a value approximating the stoichiometric air-fuel ratio of the air-fuel mixture for the engine so as to effectively operate the three-way catalyst.

Such a system is a feedback control system, in which an oxygen sensor is provided to sense the oxygen content of exhaust gases to generate an electrical signal as an indication of the air-fuel ratio of the air-fuel mixture supplied by a carburetor. The control system comprises a comparator for comparing the output signal of the oxygen sensor with a reference value, an integration circuit connected to the comparator, a driving circuit for producing square wave pulses from the output sginal of the integration circuit, and an on-off type electromagnetic valve for correcting the air-fuel ratio of the mixture. The control system operates to detect whether the feedback signal from the oxygen sensor is higher or lower than a predetermined reference value corresponding to the stoichiometric air-fuel ratio for producing an error signal for actuating the on-off type electromagnetic valve to thereby control the air-fuel ratio of the mixture.

Such a feedback control system inherently oscillates due to the detection delay of the oxygen sensor. More particularly, the mixture corrected by the on-off type electromagnetic valve is induced in the cylinder of the engine passing through the induction passage and burned therein, and thereafter discharged to the exhaust passage. Therefore, the time when the oxygen sensor detects the oxygen content of the exhaust gases based on the corrected mixture, the corrective action with the on-off type electromagnetic valve has overshot the desired point. As a result, a rich or lean mixture caused by the overshooting is induced in the engine and the deviation is detected by the oxygen sensor. Thus, the corrective action in the opposite direction will be initiated. After such oscillation of the control operation, the variation of the air-fuel ratio of the mixture will converge toward the stoichiometric ratio. Therefore, the deviation of the air-fuel ratio of the mixture is corrected to the stoichiometric ratio with some delay. Consequently, the desired reduction of the harmful constituents may not be achieved.

On the other hand, it has been found that if the three-way catalyst is exposed to such exhaust gases that, the exhaust gas content ratio oscillates periodically with respect to a mean exhaust gas content ratio at a proper period, the catalyst is activated to thereby increase the emission reduction effect.

SUMMARY OF THE INVENTION

An object of the present invention is to provide a control system in which the controlled output oscillates with a pattern which is so shaped that the direction of the deviation from the desired value may be defined, whereby the deviation from the desired value may be quickly corrected.

According to the present invention, there is provided a feedback control system comprising a dither signal generating circuit means for producing a periodical dither signal having a pattern of pulses having a period which comprises a plurality of alternating positive excursions and negative excursions, at least one of the positive excursions being lower than other of the positive excursions and at least one of the negative excursions being shallower than other of the negative excursions, shift control circuit means for shifting the level of the center line of the dither signal, driving circuit means for producing a driving output according to the dither signal, actuator means operatively connected to the driving output for producing a controlled output, detecting means for sensing the controlled output and providing a detected output signal dependent thereon, means for distinguishing higher values of the detected signal from lower values of the detected output signal and providing a distinguished output signal, the higher values being higher than a desired value, the lower values being lower than the desired value, control circuit means for comparing the distinguished output signal with a reference pulse having the same period as that of the pusles of the dither signal and for producing a control signal corresponding to the dither signal but omitting portions of the dither signal, a shift signal generating circuit means for producing a shift signal dependent on the detected signal for adjusting the shift control means, and amplitude control circuit means for decreasing the amplitude of the dither signal when said control circuit produces the control signal representing a condition of the controlled output in a central range with respect to the desired value signal, whereby the amplitude of the controlled output can be decreased.

Other objects and feature of the present invention will become apparent from the following description of a preferred embodiment with reference to the accompanying drawings.

BRIEF DESCRIPTION OF THE DRAWINGS

FIGS. 6A and 6B show the relation between the levels of the dither signal and the driving signal;

FIG. 7(*a*)–(*f*) shows the dither signal;

FIGS. 8 to 10 show the relation between the deviation of the dither signal and the output signal of a pattern detecting circuit;

FIG. 11 is a schematic view showing another embodiment of the present invention;

DETAILED DESCRIPTION OF THE PREFERRED EMBODIMENT

Figure 1:
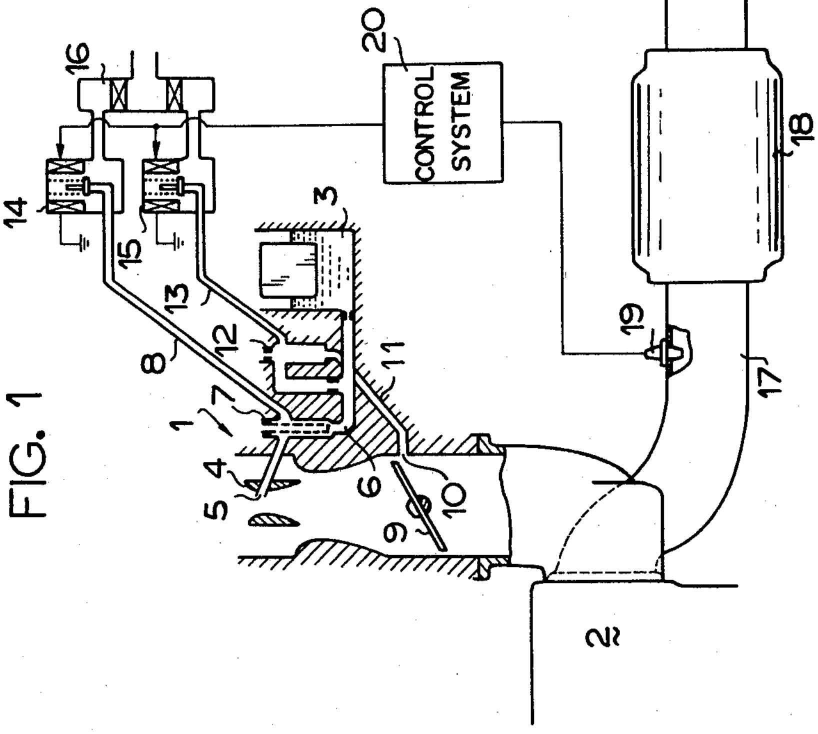
FIG. 1 is a schematic view of an air-fuel control system.

Referring to FIG. 1, a carburetor 1 communicates with an internal combustion engine 2. The carburetor comprises a float chamber 3, a venturi 4 in the intake passage, a nozzle 5 communicating with the float chamber 3 through a main fuel passage 6, and a slow port 10 provided near a throttle valve 9 and communicating with the float chamber 3 through a slow fuel passage 11. Air correcting passages 8 and 13 are provided in parallel to a main air bleed 7 and a slow air bleed 12, respectively. On-off type electromagnetic valves 14 and 15 are provided for the air correcting passages 8 and 13. The inlet port of each on-off type electromagnetic valve communicates with atmosphere through an air cleaner 16. An oxygen sensor 19 is disposed in an exhaust pipe 17 for detecting the oxygen content of the exhaust gases from the engine 2. A three-way catalytic converter 18 is disposed in the exhaust pipe 17 downstream of the oxygen sensor 19.

Figure 2:
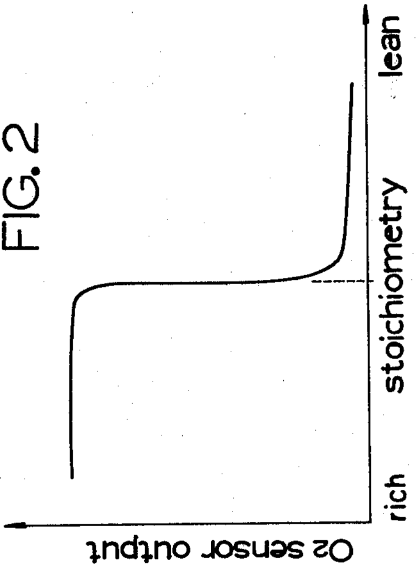
FIG. 2 is a graph showing an electromotive force of the oxygen sensor as a function of the air-fuel ratio of mixture supplied by a carburetor.

The output voltage of the oxygen sensor 19 varies sharply at an exhaust gas ratio near the stoichiometric air-fuel ratio of the mixture supplied by the carburetor as shown in FIG. 2, so that it is possible to detect whether the air-fuel mixture in the intake passage is richer or leaner than the stoichiometric ratio by detecting the voltage of the oxygen sensor 19. The output signal of the sensor 19 is fed to an electronic control system 20 for controlling the on-off type electromagnetic valves 14 and 15.

Figure 3:
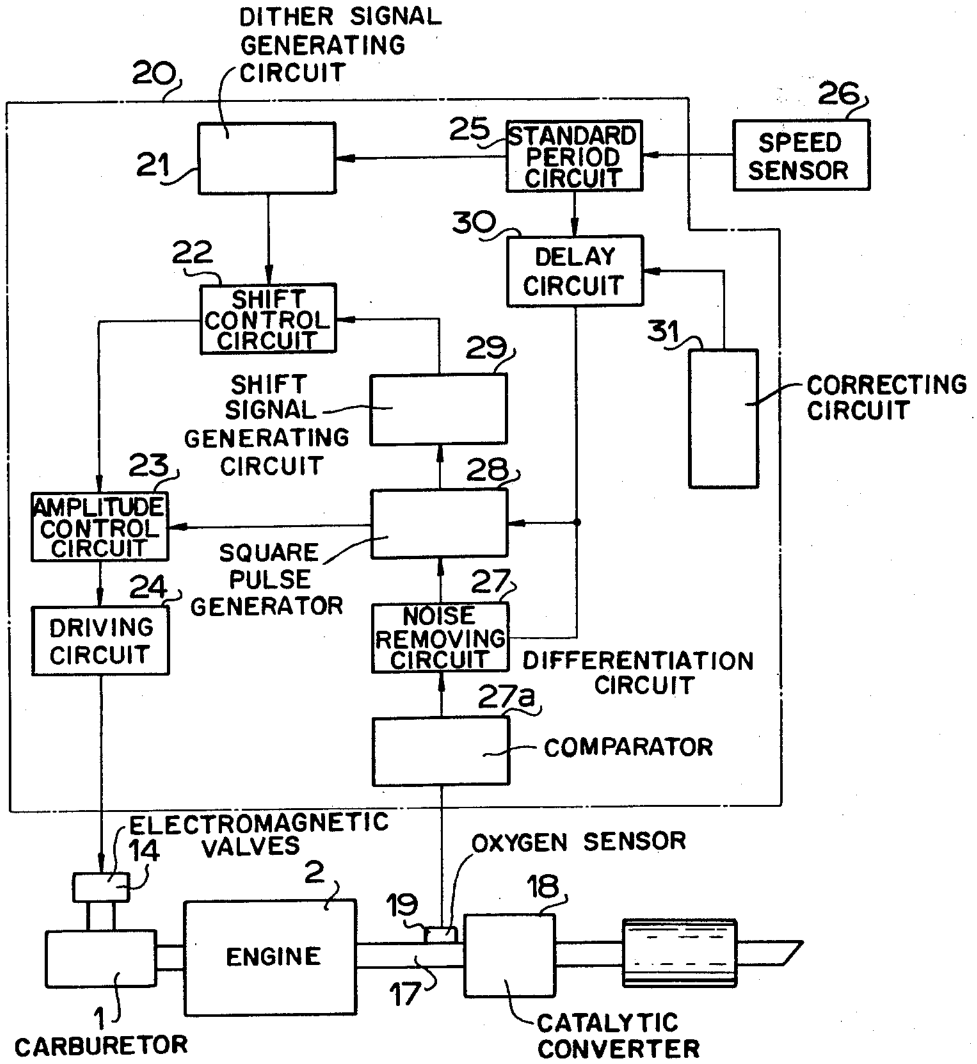
FIG. 3 is a block diagram showing an electronic control system according to the present invention.
Figure 5:
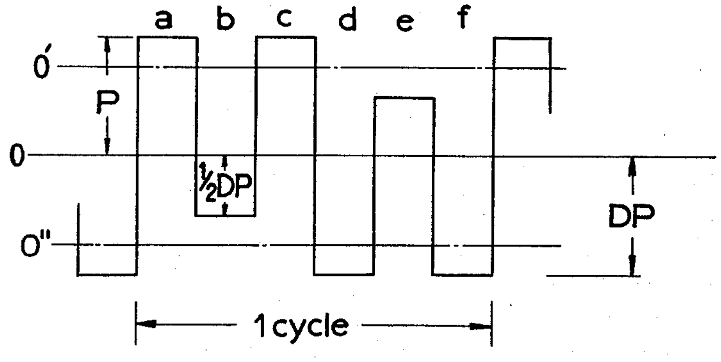
FIG. 5 shows an example of a dither signal.

Referring to FIG. 3, the electronic control system has a dither signal generating circuit 21 for producing a dither signal (a) of FIG. 7 and FIG. 5. The dither signal (a) is fed to a driving circuit 24 through a shift control circuit 22 (to be explained hereinbelow) and an amplitude control circuit 23. The driving circuit drives the on-off type electromagnetic valves 14 and 15. As shown in FIG. 5 and FIG. 7 the dither signal (a) has a voltage waveform in which a pattern is repeated in cycles. One cycle of the pattern comprises a pair of high positive excursions "a", "c", a low positive excursion "e", a pair of lowest negative excursions "d", "f" and a shallow (i.e., less low or higher) negative excursion "b". The height "P" of the high positive excursion from the center line 0 is equal to the depth "Dp" of the lowest negative excursion from the center line 0. The depth of the shallow negative excursion "b" from the center line "0", for example, is one-half the depth "Dp" of the lowest negative excursion.

The driving circuit 24 produces driving pulses as shown in FIG. 6A dependent on the input voltage having the dither pattern of FIG. 7 (a). As shown in FIG. 6A, a higher voltage corresponding to the positive excursion of the dither signal causes a driving pulse $d_p$ having a wide width, that is a large pulse duty ratio, and a lower voltage vl corresponding to the negative excursion of the dither signal causes a narrow duty pulse $p_n$ of a small pulse duty ratio. Therefore, the electromagnetic valves 14 and 15 (constituting actuator means for producing a controlled output) are actuated by the driving pulses of FIG. 6A in dependency on the voltage of the dither signal. When the valves are actuated by the wide width pulse, a lean mixture is provided since more air enters. The narrow pulse provides rich mixture. Therfore, the variation of the air-fuel ratio of the mixture supplied by the carburetor has also the same dither pattern.

FIG. 7(*a*) shows the variation of the air-fuel ratio of the mixture having the dither pattern.

When the air-fuel ratio of the mixture having the dither wave of FIG. 7(*a*) deviates from the stoichiometric ratio line "S" toward the lean side as shown in FIG. 7(*a*), the output voltage of the oxygen sensor 19 which detects the exhaust gases corresponding to the mixture varies as shown in FIG. 7(*b*).

Figure 12:
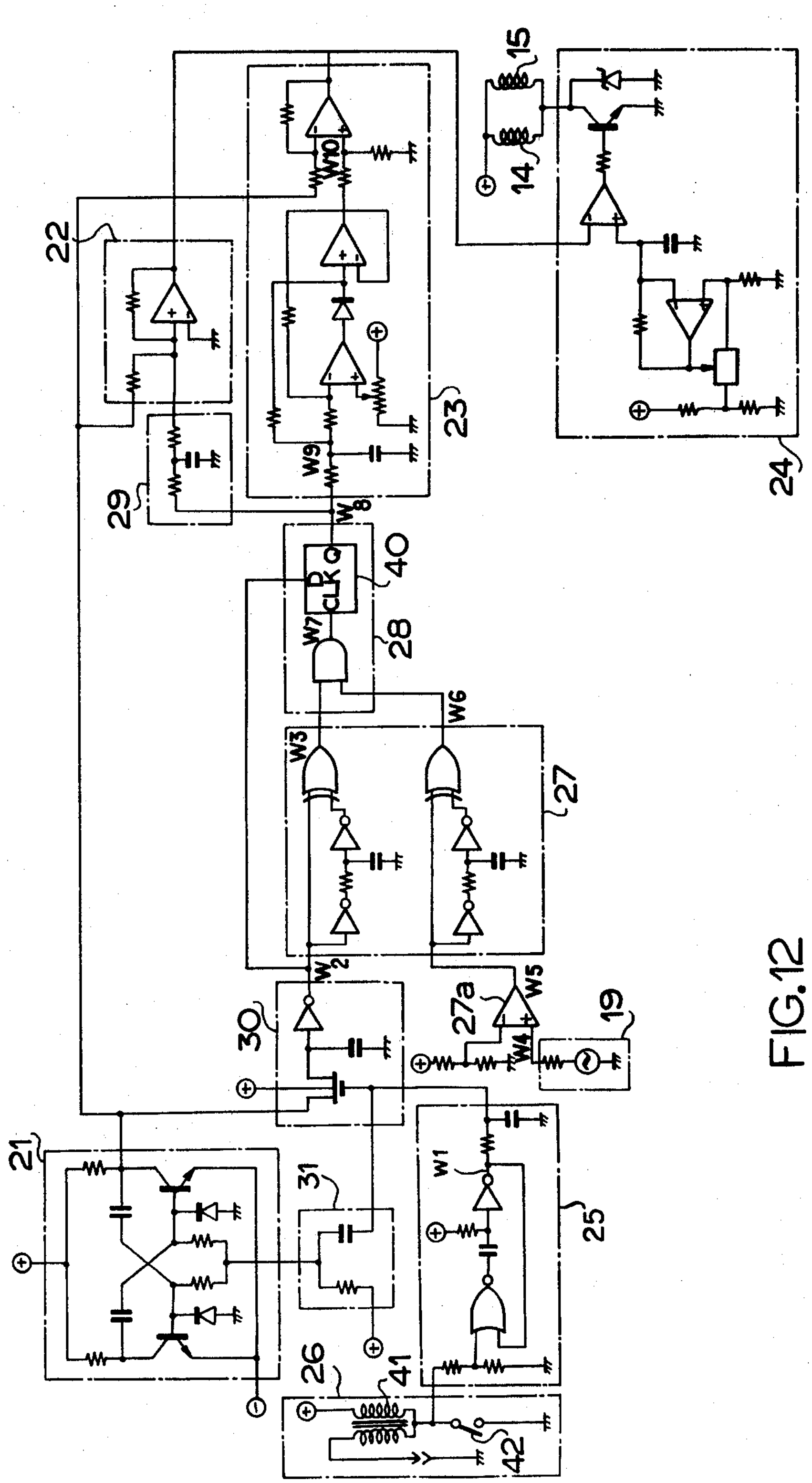
FIG. 12 shows an example of the electronic circuit of the system.
Figure 13:
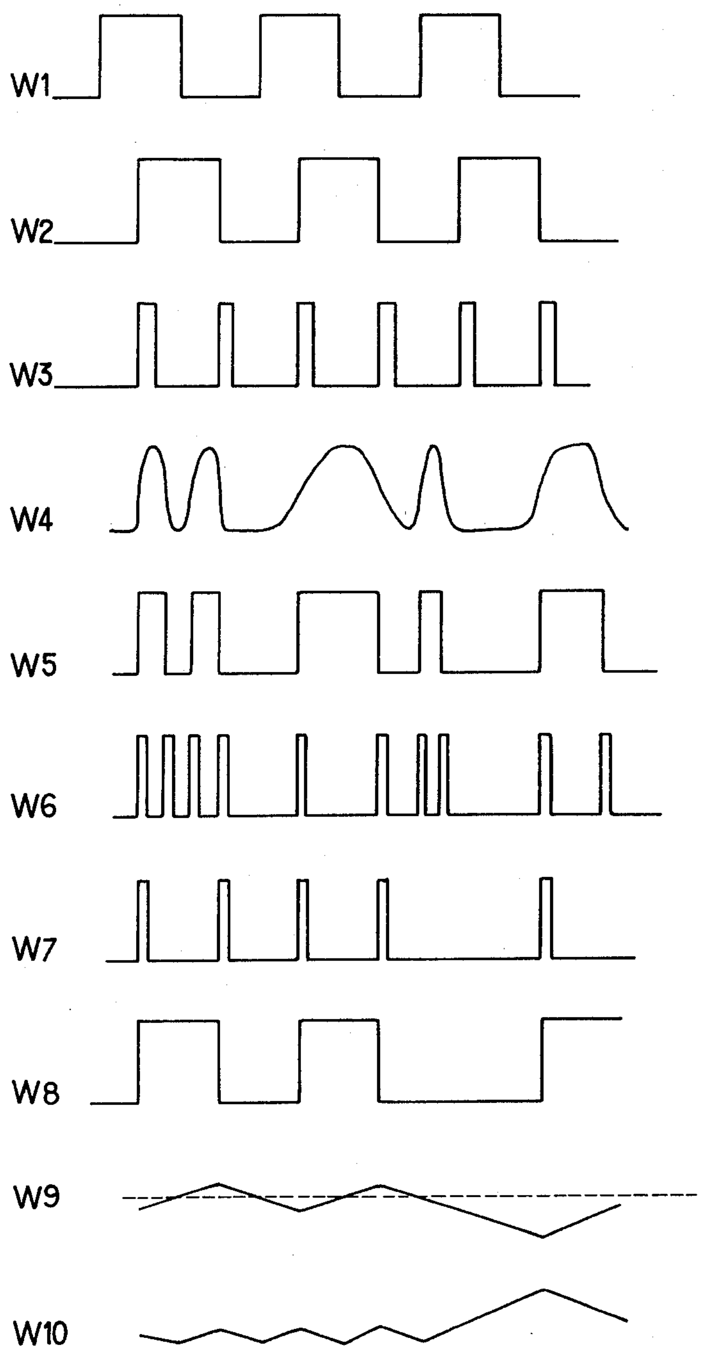
FIG. 13 shows waveforms at various locations in FIG. 12.

Since the small air-fuel ratio of the mixture corresponding to the low positive excursion "e" of the dither pattern in FIG. 7(*a*) is below the stoichiometric ratio line "S", the oxygen sensor does not produce output voltage for the portion "e". Accordingly, the waveform of FIG. 7(*b*) does not induce a wave portion corresponding to the portion "e". However, the output voltage includes noise $dS_1$, $dS_2$ caused by noise generated from the engine. The output voltage (b) of the oxygen sensor is applied to a noise removing circuit 27 via a comparator 27*a* (FIGS. 3 and 12), the latter distinguishing values higher than a certain value from values lower than the certain value and modifying the pulses of the detected output signal (FIG. 7(*b*)) into modified, squared output pulses W5 (FIG. 13). The noise removing circuit 27 comprises a differentiation circuit and a comparing circuit. The circuit 27 differentiates the output voltage of the modified oxygen sensor 19 so as to produce the signal as shown in FIG. 7 (*c*).

Figure 4:
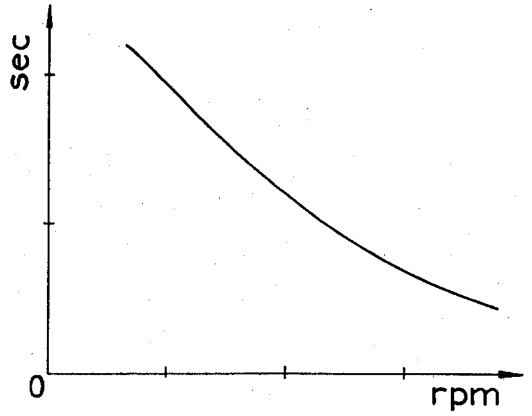
FIG. 4 is a graph showing a relation between the engine speed and the period of the reference signal.

A standard (reference) period circuit 25 is provided for producing a standard (reference) period pulse train in dependency on pulses fed from an engine speed sensor 26. The period of the standard (reference) period pulse train decreases with an increase of the engine speed as shown in FIG. 4. The speed sensor 26 comprises, for example, an ignition coil 41 and a distributor contact 42 (FIG. 12). The phase of the pulses (cf. pulses $W_1$ of FIG. 13) from the circuit 25 is adjusted by a delay circuit 30 so as to coincide with the phase of the output signal of the oxygen sensor (which also corresponds to the phase of the dither signal). A correcting circuit 31 is also provided for fine adjustment of the phase adjustment operation in the delay circuit 30. This adjusted reference period pulse train is shown in FIG. 7(*d*). The signal of FIG. 7(*c*) is compared with the adjusted reference period pulse train by the noise removing circuit 27, so that noise $dS_1$ and $dS_2$ are removed as shown in FIG. 7(*e*).

The signal of FIG. 7(*e*) is fed to a square pulse generator 28. The square pulse generator 28 produces a square output signal (shown in FIG. 7(*f*)) by triggering with the signal of FIG. 7(*e*).

Since the low positive excursion "e" of the mixture in FIG. 7(*a*) is positioned in the lean side, a wide low level portion "w" is formed in the signal of FIG. 7(*f*). Thus, the fact that the mixture having the waveform of FIG. 7(*a*) is on the lean side can be detected by the lower level portion "w" of the signal (f) derived from the oxygen sensor 19.

Figure 9:
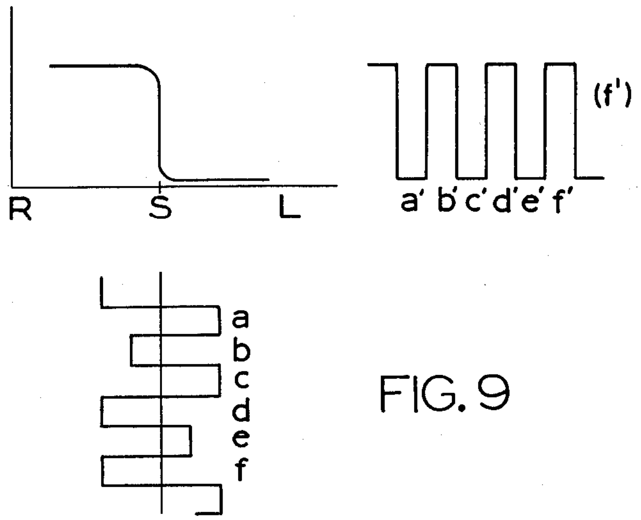

FIG. 9 shows an example of the signal (f') from the square pulse generator 28 when the air-fuel ratio of the mixture is at the stoichiometric value. (Compare the corresponding dither signal (a) but where the center line 0 has been shifted to the stoichiometric line S.) The signal from the square pulse generator 28 comprises pulses a' to f' each having the same pulse width.

Figure 10:
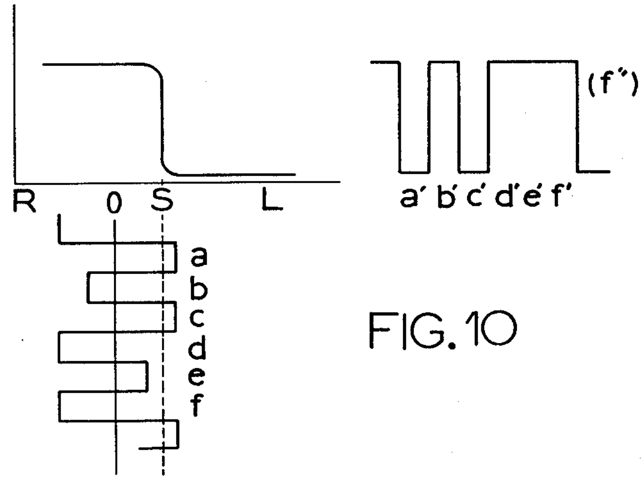

FIG. 10 shows another example of the signal (f'') when the air-fuel mixture deviates to the rich side. (Compare the corresponding dither signal where the center line 0 has been shifted to the rich side R.) The signal (f'') includes a wide high level portion d', e', f'. That is, if the positive excursions of the dither signal (which corresponds to the air-fuel ratio of the mixture) deviates from the stoichiometric value, a wide high level signal is generated.

The signal ((f') or (f'') as the case may be) is fed to a shift signal generating circuit 29 which produces a shift signal dependent upon the width of the high level or low level portion of the signal (f') or (f''). The shift signal is applied to the shift control circuit 22 so as to shift the new generated dither signal FIG. 5(*a*) fed from the dither signal generating circuit 21 in dependency thereon, that is in dependency on the detected deviation of exhaust gases which in turn is dependent on the air-fuel ratio of the mixture in the intake passage.

FIG. 8 shows an example of the change of the deviation of the dither pattern of the mixture and the variation of the output signal FIG. 7(*f*) of the square pulse generator 28. Assuming that dither pattern "A" completely deviates from the stoichiometric ratio to the rich side, the high level output signal "A'" is produced without the negative excursion. Now in dependency on the output signal "A'", the dither signal from the circuit 21 is shifted to the lean side by the shift signal from the shift signal generating circuit 29.

If the dither pattern is located as shown at "B" disposed still somewhat toward the rich side, a high level output signal "B'" is produced. Thus, the next dither signal generated from the circuit 21 is shifted by a degree in dependency on the signal "B'". It will be noted that the deviation of the dither pattern of the mixture is detected at the time $t_1$ before the pulse "B'" is completed.

When the center line 0 (in FIG. 5) of the dither pattern of the mixture coincides with the stoichiometric ratio such as the signals "C" or the center line is located such that the stoichiometric value S is in the range between the low positive excursion "e" (FIG. 5) and the shallow negative excursion "b", uniform pulses are produced. Thus, the generation of a uniform pulse output indicates the fact that the air-fuel ratio (operatively detected by the oxygen sensor) is approximately equal to the stoichiometric ratio. Thus, the shift signal generating circuit 29 does not generate the output signal when receiving the uniform pulse input.

On the other hand, the amplitude control circuit 23 operates to decrease the amplitude of the dither signal (a) in response to the occurrence of a uniform pulse signal (this uniform pulse signal having pulses each with the same period as corresponding pulses of the dither signal) from the square pulse generator 28. Accordingly, the amplitude is reduced as shown by the arrow U in FIG. 8. By the reduction of the amplitude of the dither signal, the oscillation of the air-fuel ratio of the mixture can converge further within a small range close to the stoichiometric ratio. Thus, a decrease of the variation of the air-fuel ratio may be performed.

FIG. 11 shows another embodiment, in which the present invention is applied to an engine, provided with a fuel injection system. A fuel injector 34 is provided on an intake manifold 33 downstream of an air filter 32. The fuel injector 34 communicates with a fuel tank 35 having a fuel pump (not shown) through a conduit 36. The fuel injector 34 is operatively connected to a control unit 37 having the control system 20 of FIG. 3. The oxygen sensor 19 and the speed sensor 26 are provided for controlling the control system 20. In such a system, the fuel injector 34 is operated by the dither signal in the same manner as the previous embodiment, whereby effective emission control may be performed.

FIG. 12 shows an example of the electronic circuit of the system essentially the same as FIG. 3. The square pulse generator 28 comprises an AND gate and a D-JK flip-flop 40. The speed sensor 26 comprises an ignition coil 41 and a distributor contact 42. FIG. 13 shows waveforms at various locations in FIG. 12, in which waveforms $W_1$ to $W_{10}$ correspond to points in FIG. 12 designated by the same reference, respectively.

From the foregoing it will be understood that the present invention provides a control system in which the controlled output that is the process quantity, is caused to oscillate by the diether signal in a pattern, so that the necessary minimum error signal can be produced. Thus, a variation in the output can converge rapidly to the desired value. It will be noted that other dither signals having a different pattern than that of the illustrated signal can be used. When a sensor other than an oxygen sensor is used which has a linear output voltage, it is necessary to provide a comparator by which the output voltage is compared with a standard level corresponding to the stoichiometric ratio so that the output may be sharply changed at the standard level.

Herein the words "removed" "omitted" "does not include" or the like referring to portions of output signals refer equally to omitting a corresponding positive or negative excursion of a detected dither variation, omitting a negative excursion meaning providing a positive excursion in the output signal and omitting a positive excursion meaning providing a negative excursion in the output signal or vice versa.

What is claimed is:

1. A feedback control system comprising a dither signal generating circuit means for producing a periodical dither signal having a pattern of pulses having a period which comprises a plurality of alternating positive excursions and negative excursions, at least one of said positive excursions being lower than another of said positive excursions and at least one of said negative excursions being shallower than another of said negative excursions, said dither signal defining a center line having a level, shift control circuit means for shifting the level of the center line of said dither signal so as to provide a shifted dither signal from time to time, driving circuit means operatively connected to said shift control circuit means for producing a driving output depending on said dither signal, actuator means operatively connected to said driving output for producing a controlled output, output means including detecting means for sensing the controlled output and, means for distinguishing higher values of said controlled output from lower values of said controlled output, and providing an output signal, said higher values being higher than a desired value, said lower values being lower than said desired value, comparing circuit means for comparing said output signal with reference pulses having the same period as that of corresponding of said pulses of said dither signal and for producing a control signal corresponding to said dither signal but said control signal omitting corresponding portions of the dither signal from time to time dependent on said output signal, a shift signal generating circuit means for producing a shift signal dependent on said control signal for shifting the level of said center line of said dither signal from time to time via said shift control circuit means, and amplitude control circuit means for decreasing the amplitude of said dither signal fed to said driving circuit means when said comparing circuit means produces said control signal such that the latter represents a position of said controlled output such that said desired value is between level-wise closest of said at least one of said positive excursions and of said at least one of said negative excursions respectively, whereby the amplitude of the controlled output is decreased.

2. The feedback control system according to claim 1, wherein said comparing circuit means includes a noise removing circuit means for removing noise included in said output signal and a square pulse generator means.

3. The feedback control system according to claim 2, further comprising a reference period generating circuit means for producing a reference signal having said reference pulses and operatively controlling the period of said dither signal and operations of said comparing circuit means including said noise removing circuit means.

4. The feedback control system according to claim 3, further comprising delay circuit means operatively connected between said reference period generating circuit means and said comparing circuit means including said noise removing circuit means for adjusting the phase of said reference signal from said reference period generating circuit means so as to coincide with the phase of said output signal for producing an adjusted reference signal having adjusted said reference pulses.

5. The feedback control system according to claim 1, wherein said comparing circuit means cooperatively with said output means constitute means for converting ranges of predetermined deviations of a center line of said controlled output from said desired value, said ranges corresponding to positions where the desired value lies between or beyond different of said excursions, into pulses of a width dependent on respective of said ranges of predetermined deviations including the omitted corresponding portions of the dither signal from time to time, said control signal includes said pulses of said width dependent on said ranges of predetermined deviations respectively from time to time, said shift signal generating circuit means produces said shift signal dependent on said width of said pulses of said control signal respectively from time to time, said shift control circuit means is dependent on said shift signal for shifting the level of said center line of said dither signal in a direction and magnitude compensatingly opposite to said ranges of predetermined deviations of said center line of said controlled output from said desired value, and said shift signal generating circuit means for not producing any shift signal when a deviation of the center line of said controlled output is in a predetermined central range of said desired value which represents a position of said controlled output such that level-wise centralmost of said at least one of said positive excursions and of said at least one of said negative excursions respectively are between said desired value.

6. The feedback control system according to claim 5, wherein said shift signal generating circuit means is for producing said shift signal upon detection of said control signal at a time before completion of a cycle of said control signal corresponding to a cycle of said output signal.

7. The feedback control system according to claim 2 or 3, wherein said square pulse generator means comprises an AND gate having two inputs respectively connected to an output of said noise removing circuit means and to said reference pulses, and a flip flop is connected to an output of said AND gate.

8. The feedback control system according to claim 2, wherein said comparing circuit means via said square pulse generator means cooperating via said output means for producing said control signal with uniform pulses adapted not to produce said shift signal and to cause no shifting of said level of the center line of said dither signal when said controlled output is located such that said desired value is in a range between level-wise centralmost of said at least one negative excursion and said at least one positive excursion, respectively.

9. A feedback control system comprising a dither signal generating circuit means for continuously generating a periodical, initial dither signal having a pattern of pulses having a period which comprises a plurality of alternating positive excursions and negative excursions, at least one of said excursions of at least either of said positive excursions and said negative excursions having a level different from another of said excursions of said either of said positive excursions and said negative excursions, said dither signal having a level, shift control circuit means for shifting said initial dither signal along with the level of said initial dither signal thereby producing a shifted dither signal, controlled output producing means operatively connected to an output of said shift control circuit means for producing at a location a controlled output as a function of said shifted dither signal, said controlled output varying with a dither pattern substantially according to said shifted dither signal, means for sensing the controlled output and distinguishing values of said controlled output higher than a desired value from values of said controlled output lower than said desired value and providing a control signal substantially corresponding to said shifted dither signal but omitting portions of said control signal corresponding to portions of the controlled output respectively above and below said desired value from time to time, a shift signal generating circuit means connected to said shift control circuit means and for producing a shift signal dependent on said control signal for shifting, via said shift control circuit means, said initial dither signal along with the level thereof from time to time in a direction compensatingly opposite to deviations of said controlled output from said desired value, and said shift signal generating circuit means for not producing a shift signal when a deviation of said controlled output is such that said desired value is between level-wise centralmost of said at least one of said excursions of said either of said positive excursions and said negative excursions and another of said excursions, amplitude control circuit means for decreasing the amplitude of said shifted dither signal fed to said controlled output producing means when said control signal represents a position of said controlled output such that said desired value is between level-wise centralmost of said at least one of said excursions of said either of said positive excursions and said negative excursions and said another of said excursions, whereby the amplitude of the controlled output is decreased when the level of said controlled output lies within a central range relative to said desired value.

10. The feedback control system according to claim 1 or 9, wherein said omitted portions are said positive excursions lower than said desired value and said negative excursions at least equal to said desired value.

11. The feedback control system according to claim 1 or 9, wherein said controlled output is an air-fuel ratio.

12. The feedback control system according to claim 9, wherein said means for sensing senses the controlled output downstream of said location.

13. The feedback control system according to claim 12, further comprising means for influencing said controlled output downstream of said location and upstream of said means for sensing.

14. The feedback control system according to claim 1, 8 or 9, wherein said center line is centrally spaced between said positive excursions and said negative excursions.

15. The feedback control system according to claim 9, wherein at least one of said positive excursions is lower than other of said positive excursions and at least one of said negative excursions is higher than other of said negative excursions and lower than said at least one of said positive excursions.

16. The feedback control system according to claim 1, wherein said at least one positive excursion is higher than said at least one negative excursion.

17. The feedback control system according to claim 1, 8 or 9, wherein said shift signal generating circuit means comprises means for integrating said control signal to produce said shift signal and for feeding the latter to a common input of said shift control circuit means to which said dither signal is fed.

18. The feedback control system according to claim 1 or 9, wherein said amplitude control circuit means comprises means for integrating said control signal and circuit means for modifying the integrated said control signal and an operational amplifier having a resistor fed back from an output thereof to one input thereof to which input said dither signal is fed, another input thereof operatively receiving the modified integrated control signal.

19. The feedback control system according to claim 18, wherein said modifying means includes a first operational amplifier and a second operational amplifier, a diode connected between the output of said first operational amplifier and one input of said second operational amplifier, a first resistor is connected between one input of said first operational amplifier and the output of said second operational amplifier, the output of said second operational amplifier is connected to said another input of said first-mentioned operational amplifier, said integration means is operatively connected to said one input of said first operational amplifier, a second resistor is connected to said one input of said second operational amplifier and operatively connected to said one input of said first operational amplifier, a grounded adjustable resistor is connected to another input of said first operational amplifier, another input of said second operational amplifier is connected to the output of said second operational amplifier.

20. A feedback control system comprising a dither signal generating circuit means for continuously generating a periodical, initial dither signal having a pattern of pulses having a repeating cycle of a period comprising only a plurality of more than one of said pulses and which comprises a plurality of alternating positive excursions and negative excursions, said dither signal defining a center line having a level, shift control circuit means for shifting said initial dither signal along with the level of the center line of said initial dither signal thereby producing a shifted dither signal, controlled output producing means operatively connected to an output of said shift control circuit means for producing at a location a controlled output as a function of said shifted dither signal, said controlled output varying with a dither pattern substantially according to said shifted dither signal, means for sensing the controlled output and distinguishing values of said controlled output higher than a desired value from values of said controlled output lower than said desired value providing a control signal thereof substantially corresponding to said shifted dither signal but omitting portions of said control signal corresponding to portions of the controlled output respectively higher and lower than said desired value from time to time, a shift signal generating circuit means connected to said shift control circuit means and for producing a shift signal dependent on said control signal for level-wise shifting, via said shift control circuit means, of said initial dither signal along with the level of the center line thereof from time to time, said shift control circuit means dependent on said shift signal for shifting said initial dither signal along with the level of said center line of said initial dither signal in a direction and magnitude compensatingly opposite to predetermined ranges of deviations of a center line of said controlled output from said desired value, and said shift signal generating circuit means for not producing said shift signal when said shift signal represents a condition of said controlled output in a level-wise central range with respect to said desired value, and amplitude control circuit means for decreasing the amplitude of said shifted dither signal fed to said controlled output producing means when said control signal represents a position of said controlled output in the level-wise central range with respect to said desired value, whereby the amplitude of the controlled output is decreased when the center line of said controlled output is within a predetermined range of said desired value.

* * * * *